United States Patent [19]
Horichi

[11] 3,952,247
[45] Apr. 20, 1976

[54] LEVEL INDICATING APPARATUS FOR P.C.M. TRANSMITTING SYSTEM

[75] Inventor: Tetsuya Horichi, Yokohama, Japan
[73] Assignee: Sony Corporation, Tokyo, Japan
[22] Filed: Sept. 16, 1974
[21] Appl. No.: 505,994

[30] Foreign Application Priority Data
Sept. 14, 1973 Japan............................ 48-104075

[52] U.S. Cl.................................. 324/133; 324/96; 324/122
[51] Int. Cl.² .................. G01R 13/02; G01R 19/00
[58] Field of Search ............ 324/133, 96, 122, 120, 324/99 D, 103 P, 115

[56] References Cited
UNITED STATES PATENTS

| | | | |
|---|---|---|---|
| 3,795,863 | 3/1974 | Umeda et al. ...................... | 324/122 |
| 3,825,827 | 7/1974 | Tumbush......................... | 324/103 P |
| 3,866,120 | 2/1975 | Ford ..................................... | 324/96 |

*Primary Examiner*—R. V. Rolinec
*Assistant Examiner*—Ernest F. Karlsen
*Attorney, Agent, or Firm*—Lewis H. Eslinger; Alvin Sinderbrand

[57] ABSTRACT

Level indicating apparatus includes a plurality of light emitting indicators each indicating a different level of analog signal encoded in pulse form, and two indicators responsive to the most significant bit of the pusle signal to indicate polarity and further responsive, by means of a logic circuit, to pulse coded signals indicating the maximum acceptable analog signal amplitude. Pulse lengthening circuits are provided to keep the indicators turned on for a predetermined time after the signal that actuates them has been removed.

7 Claims, 4 Drawing Figures

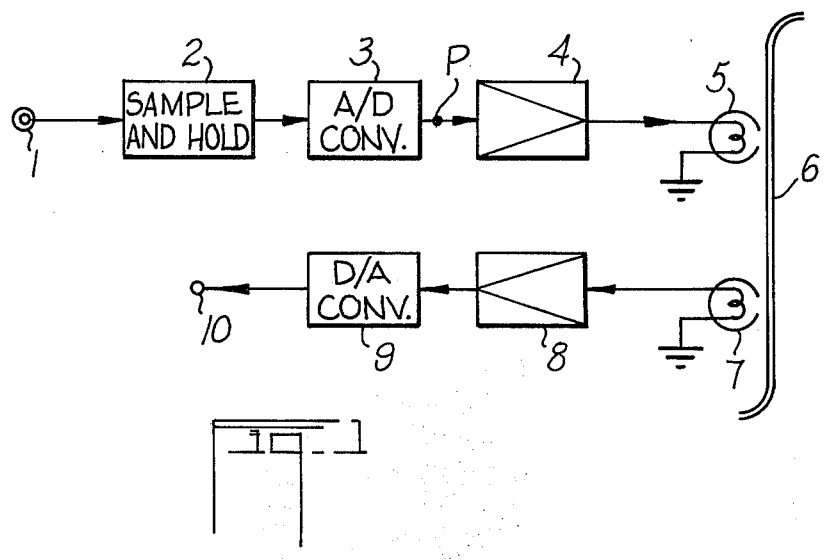
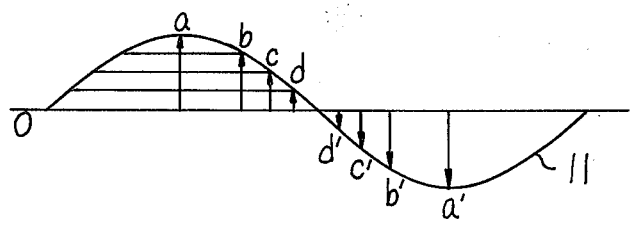
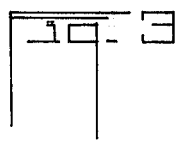
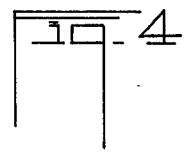
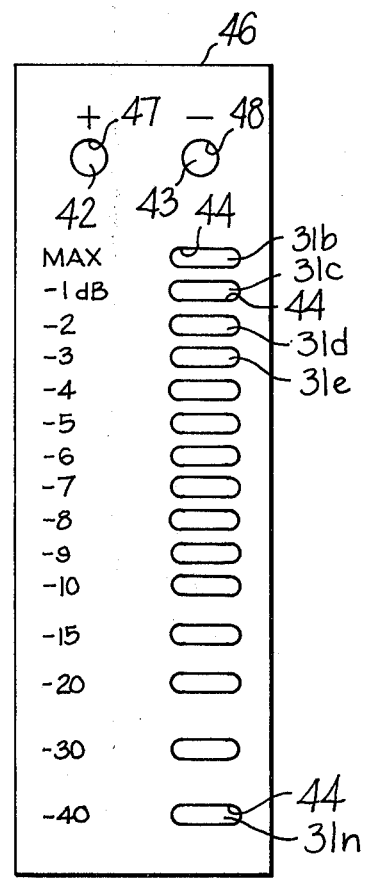

LEVEL INDICATING APPARATUS FOR P.C.M. TRANSMITTING SYSTEM

BACKGROUND OF THE INVENTION

Field of the Invention

This invention relates to level indicating apparatus responsive to pulse coded signals to indicate the equivalent analog amplitude.

The Prior Art

Conventional signal handling systems are known in which analog signals are encoded in pulse form in which they are then recorded or transmitted or otherwise acted upon before being reconverted to analog form. The pulse code has a predetermined arrangement of the pulses according to each analog amplitude. For example, a certain analog signal amplitude range may be divided into a selected number of levels. The number of these levels is determined by the number of bits in the code. If the actual analog signal to be encoded has an amplitude that exceeds the encoding capability of the system, the resulting encoded pulse signal will, when reconverted into analog form, be very distorted.

It is desirable to monitor the amplitude of the analog signal so that the gain of the circuit may be controlled to keep the peak signals within the acceptable range. It is common to provide a meter with a needle to indicate the amplitude of the signal. However, such meters have mechanical inertia that delays their response to short signal pulses and prevents the needle from indicating precisely the amplitude of the signal. Furthermore, it is difficult to cause such meters to retain a signal level indication for a predetermined length of time after the signal has dropped to a lower level. It is also difficult to arrange to have such meters indicate whether peak values of the signal are of positive or negative polarity. Finally, such meters respond to analog signals but not to signals that have been encoded into pulse form.

Level indicating means have been provided to respond to pulse coded signals by applying such signals to suitable logic circuits, such as AND or NAND circuits. Only when the pulse coded signal corresponds to the maximum permissible amplitude of the analog signal, which may be referred to as the saturation level of the analog signal, does the AND or NAND circuit produce an output signal. The output signal may be applied to a lamp or a light emitting diode or the like to indicate that the signal has reached its saturation level. However, even such indicators have the deficiency that they only indicate the saturation level after it has been reached, which makes it difficult to keep the gain of the circuit low enough to keep the analog signal below its saturation level without keeping it at too low a value. Accordingly, it has been common to use such digital indicating apparatus along with a conventional V.U. meter for adjusting the signal level.

It is one object of the present invention to provide improved level indicating apparatus responsive to pulse encoded signals to indicate corresponding analog amplitudes thereof.

It is another object of this invention to indicate saturation levels and the polarity of such saturation levels.

It is another object of this invention to provide a continuous indication of the analog signal level based on the pulse encoded signals.

It is another object of this invention to provide a level indicating apparatus for pulse encoded signals in which the response time to changes in signal level is very fast and the time of retention of the indication is arbitrarily adjustable.

SUMMARY OF THE INVENTION

In accordance with the present invention, the indicating apparatus is connected to receive pulse encoded signals, for example the output signals from an analog-to-digital converter. The signals pass through different input lines, each corresponding to a digital bit level. The line that transmits the most significant digital bit signal, that is, the digital signal indicating, basically, the polarity of the signal. The line that carries the most significant bit is connected to each half-adder circuit and each of the other lines, in decreasing bit level order, is connected to a successive half-adder circuit. All of the half-adders are connected to a line decoder circuit. The line decoder circuit responds to the input signal condition applied by the half-adders to produce output signals on one or more of the decoder's output terminals corresponding to progressively greater analog signal amplitudes. Each of these output terminals is connected to means to actuate a respective light emitting indicator. Such means may include pulse lengthening means, such as a monostable multivibrator, and interconnecting means, such as OR circuits, to actuate all indicators below the one that momentarily indicates the highest instantaneous signal level. A further logic circuit is connected to the output of the line decoder that corresponds to the saturation level signal and is connected to the input line that carries the most significant bit. This logic circuit provides an output signal over one or the other of two lines, depending on the polarity of the saturation level signal, and these two lines are connected to two separate indicators that indicate maximum signal level and the polarity of that signal.

BRIEF DESCRIPTION OF THE DRAWINGS

FIG. 1 is a prior art circuit showing, in block form, a pulse encoding section, a recording section, and a decoding section.

FIG. 3 is a graph of a signal waveform indicating the correlation between amplitude levels and pulse bits.

FIG. 4 is a panel for an indicator as constructed according to FIG. 2.

DESCRIPTION OF THE PREFERRED EMBODIMENT

Figure 2:
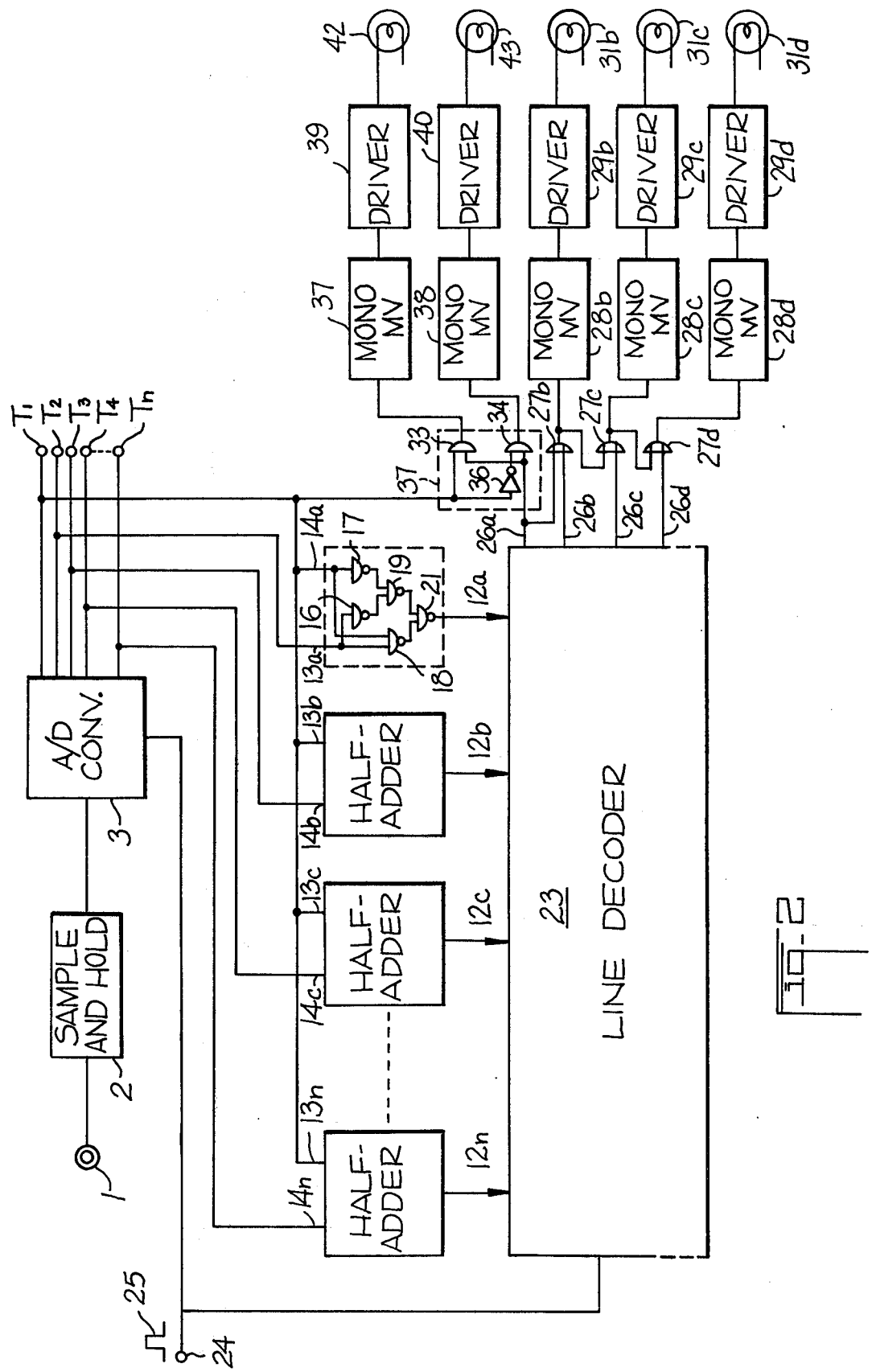
FIG. 2 is a block diagram of an indicator circuit according to the present invention.

FIG. 1 is a block diagram of a conventional pulse code modulation (P.C.M.) recording and playback system in which an analog input signal to be recorded is applied to an input terminal 1. This terminal is connected to a sample-and-hold circuit 2, the output of which is connected to an analog-to-digital converter 3. The output terminal of the latter is connected by an amplifier 4 to a magnetic recording head 5 to record the converted, or encoded, digital pulse signals on a magnetic recording tape 6.

The playback section of the system in FIG. 1 includes a magnetic reproducing head 7 that picks up the digital pulse signal recorded on the tape 6. The reproduced signal is applied to an amplifier 8, the output of which is connected to a digital-to-analog converter 9. The output signal of the latter is available at an output terminal 10.

The operation of the system in FIG. 1 may be conventional. The analog signal applied to the terminal 1 is sampled in the sample-and-hold circuit 2, which may be considered to include a sampling pulse generator. The resulting stair-step waveform signal is then applied to the A/D converter 3 which, at the sampling rate, converts the amplitude of the level step portions of the stair-step waveform into pulse signals according to a code that correlates each level step value with a group of pulses arranged, for example, in binary form. These pulses are amplified by the amplifier 4 and recorded on the tape 6 by the magnetic head 5. In due time, they are reproduced from the tape 6 by the magnetic head 7 and amplified by the amplifier 8 and applied to the D/A converter 9. The latter decodes the pulse signals back into an analog form similar to that applied to the A/D converter 3. The reconverted analog signal is available at the terminal 10, and if there are enough levels in the code and if the sampling is at a high enough repetition rate, the waveform of the reconverted analog signal will correspond closely to the original analog signal at the input terminal 1.

The measuring apparatus of the present invention is connected to the conventional circuit in FIG. 1 at the point P between the A/D converter 3 and the amplifier 4. The apparatus is shown in FIG. 2 and the input terminal 1, the sample-and-hold circuit 2, and the A/D converter 3 of FIG. 1 are also included in FIG. 2. Instead of a single output terminal for the A/D converter 3, FIG. 2 shows a plurality of output terminals $T_1 - T_4$ and $T_n$ corresponding to the number of levels of magnitude of the signal encoded. These levels are illustrated with respect to a sinusoidal signal 11 in FIG. 3. If the input signal at the terminal 1 is coded by a three bit binary digital signal, which is a sufficient number of bits to illustrate the invention although more bits may be used in actual practice, the analog signal is divided into four steps in each of the positive and negative half cycles. These steps are indicated by the letters $a, b, c, d$, $a', b', c'$, and $d'$. The levels may be considered to represent voltage levels and there is an equal voltage difference between adjacent pairs of levels. The binary digit code for the four levels in FIG. 3 is as follows:

TABLE 1

|  |  | $n_1$ | $n_2$ | $n_3$ |
|---|---|---|---|---|
|  | a | 1 | 1 | 1 |
| positive | b | 1 | 1 | 0 |
| half cycle | c | 1 | 0 | 1 |
|  | d | 1 | 0 | 0 |
|  | d' | 0 | 1 | 1 |
| negative | c' | 0 | 1 | 0 |
| half cycle | b' | 0 | 0 | 1 |
|  | a' | 0 | 0 | 0 | wherein $n_1$, $n_2$, and $n_3$ are the bits of the binary code.

In FIG. 2 the relationship between the bits $n_1$, $n_2$, $n_3$ etc. and the output terminals $T_1$, $T_2$, $T_3$, etc. is shown. The terminal $T_1$ is connected to each of a group of half-adders 12a, 12b, 12c, . . . 12n, and each of the half-adders has a second input terminal connected, respectively, to the terminals $T_2$, $T_3$, $T_4$, . . . $T_n$.

The circuits of all of the half-adders are identical and only the circuit in the half-adder 12a is shown in detail. It includes two input terminals 13a and 14a each of which is connected to an inverter 16 and 17, respectively, and to a NOR gate 18. The outputs of the inverters 16 and 17 are connected to the two input terminals of another NOR gate 19 and the output terminals of the NOR gates 18 and 19 are connected to the input terminals of a third NOR gate 21. The output terminal 22a of the NOR gate 21 is the output terminal of the half-adder 12a and is connected to one of the input terminals of a line decoder 23.

All of the other half-adders 12b–12n have corresponding input terminals 13b–13n connected together to the terminal $T_1$ and input terminals 14b–14n connected to the terminals $T_3$–$T_n$, respectively. The output terminals 22b–22n of the half-adders 12b–12n are connected to the line decoder 23. A clock pulse signal source is connected to an input terminal 24 and a clock pulse 25 is fed from the terminal 24 to the A/D converter 3 and to an input terminal of the line decoder 23.

The line decoder 23 has a number of output terminals of which only output terminals 26a–26d are shown. Each of the terminals, 26b–26d is connected to one input of an OR gate 26b–26d, respectively. The terminals 26a–26d correspond, as will be described hereinafter, to successively decreasing signal levels. Each of the OR gates 26b–26d has a second input terminal connected to the next higher level of the output terminals 26a–26c. In the case of the OR gate 27b, its second input terminal is connected directly to the output terminal 26a, but in the case of the OR gate 27c and 27d, the second input terminal is connected to the output terminal of the next higher OR gate 27b and 27c, respectively.

The OR gates 27b–27d are connected to pulse-lengthening circuits in the form of monstable multivibrators 28b–28d, respectively. The monostable multivibrators are connected, in turn, to driver circuits 29b–29c, that control current supplied to indicator lights 31b–31d, respectively. These lights may be small incandescent bulbs or light emitting diodes or any other suitable light emitting devices.

The output terminal 26a of the line decoder 23 is connected to a different circuit than the terminals 26b–26d. The terminal 26a is connected to a logic circuit 32 which has another input terminal connected to the terminal $T_1$. The logic circuit 32 comprises two AND gates 33 and 34, each of which has one input terminal connected to the terminal 26a. The terminal $T_1$ is connected directly to the second input terminal of the AND gate 33 and is connected through an inverter 36 to the second input terminal of the AND gate 34. The output terminal of the AND gate 33 is connected to a pulse-lengthening circuit 37 in the form of a monostable multivibrator and to the output terminal of the AND gate 34 is connected to another pulse-lengthening circuit in the form of a monostable multivibrator 38. The latter monostable multivibrators are connected, respectively, to a pair of driver circuits 39 and 40 that control the current to another pair of light-emitting devices 42 and 43.

A suitable physical arrangement for light-emitting devices 31b, 31c, 31d, . . . 31n is shown in FIG. 4. These devices are located behind apertures 44 in a panel 46. In accordance with the operation of the invention, signal levels are indicated alongside each of the apertures 44, starting with a maximum signal level at the top and indicating the number of db drop from the maximum level for each of the successively lower apertures 44. The operation of the level indicating apparatus of FIG. 2 is based on the fact that the input signal applied to the terminal 1 in FIG. 1 is an AC signal with excursions on each side of a zero axis. If the signal were a sinusoidal signal such as is shown in FIG. 3, the excursions would be of equal amplitude, but the fact is that the signal is very likely to have a complex waveform with excursions of different amplitudes from one instant to the next. In keeping the amplitude of the signal low enough to prevent distortion due to exceeding the available levels in the A/D converter 3, it is the magnitude of the signal rather than its absolute value that is important. It does not matter whether the signal excursion is positive or negative; an excessive excursion of either polarity will produce distortion. As a result, the signal level is indicated by the light emitted from the panel 46 in FIG. 4 in terms of signal magnitude, not polarity except for the highest permissible level.

An operator looking at the panel 46 when the apparatus of FIG. 2 is operating, would see virtually a dancing column of light beginning at the bottom indicator 31n and going up toward the top indicator 31b. The apparent movement of the light or change in the height of the column is independent of the polarity of the signal and, by monitoring it, the operator can adjust the amplitude so that it is as high as possible in order to give the best possible signal to noise ratio of the recorded signal on the tape 6, but without being so high as to produce distortion in the analog-to-digital conversion. If there are occasional peak voltages that reach, or even exceed, in magnitude the levels $a$ and $a'$ in FIG. 3, they would actuate the light-emitting indicators 42 or 43. Unlike the indicators for lower amplitude signals, the latter indicators would show polarity as well as magnitude. Such information could be used, for example, to alert the operator of the necessity to adjust an offsetting bias voltage without necessarily adjusting a volume control for the analog signal.

In order to produce the type of indication just described, the apparatus in FIG. 2 must respond to the pulse code signal from the A/D converter 3 to produce the same indication for digital signals that correspond to positive analog signals as to negative analog signals of the same magnitude. Such response is obtained by the half-adders 12a–12n. The half-adder 12a is controlled only by the bits $n_1$ and $n_2$. The zero axis of the incoming analog signal represented by a three-bit digital number is shown in Table 1 to correspond to a binary signal between the binary numbers 100 and 011, which, in turn, correspond to the levels $d$ and $d'$ in FIG. 3. Thus, for positive polarity signals the bit $n_1$ in Table 1 would be a 1 and would be derived from the terminal $T_1$ in FIG. 2 and applied to the terminal 13a. The bit $n_2$ derived from the terminal $T_2$ would be 0 for low level excursions from the zero axis up to the level $c$ and would be 1 for digital signals corresponding to analog signal above that level.

Assuming that a 1 level signal, or as it is commonly stated, a 1 is applied to both of the input terminals 13a and 14a of the half-adder 12a, the output of the NOR gate 18 would be a 0 and the output of each of the inverters 16 and 17 would also be a 0. The 0 from the inverters 16 and 17 would cause the output of the NOR gate 19 to be a 1, thereby causing the NOR gate 21 to be a 0 at its output terminal 22a.

If the signal applied to the input terminal 1 is of positive polarity but is of a lower amplitude, the $n_2$ bit applied to the input terminal 14a would be 0. The result of applying a 1 to the input terminal 13a and a 0 to the terminal 14a would be to cause the output of the NOR gate 18 to be a 0. The output of the inverter 16 would be a 0 and the output of the inverter 17 would be a 1.

These two levels applied to the NOR gate 19 would produce an output of 0. Since both inputs to the NOR gate 21 would thus be 0, the output signal at the output terminal 22a would be a 1.

If the analog signal applied to the input terminal 1 had a negative polarity but a small amplitude, the bit $n_1$ at the terminal $T_1$ would be 0, but the bit $n_2$ a the terminal $T_2$ would be 1. Thus, the conditions at the input terminals 13a and 14a of the half-adder 12a would be exactly the reverse of the conditions for low level positive polarity signals and would result in a slignal level of 1 at the output terminal 22a, the same as for low level positive signals.

If the analog signal applied to the input terminal 1 were negative and had a high magnitude, both of the bits $n_1$ and $n_2$ would be 0. Applying 0 level signals to both of the input terminals 13a and 14a would cause the output terminal of the NOR gate 18 to have a 1 level, and this would automatically cause the output terminal 22 of the NOR gate 21 to have a 0 level.

Because the circuit 12a is a half-adder for the bits $n_1$ and $n_2$ the signal at its output terminal 22a is referred to as the complement of $(n_1 + n_2)$, and the values of the complements of $(n_1 + n_2)$ that occur at the terminal 22a and of $(n_1 + n_3)$ that occur at the terminal 22b are given in the following Table 2:

TABLE 2

|  |  | $n_1$ | $n_2$ | $n_3$ | OUTPUTS OF HALF-ADDERS | |
|---|---|---|---|---|---|---|
|  |  |  |  |  | The Complement of $(n_1 + n_2)$ | The Complement of $(n_1 + n_3)$ |
| positive duration signal 0 | a | 1 | 1 | 1 | 0 | 0 |
|  | b | 1 | 1 | 0 | 0 | 1 |
|  | c | 1 | 0 | 1 | 1 | 0 |
|  | d | 1 | 0 | 0 | 1 | 1 |
| negative duration signal | d' | 0 | 1 | 1 | 1 | 1 |
|  | c' | 0 | 1 | 0 | 1 | 0 |
|  | b' | 0 | 0 | 1 | 0 | 1 |
|  | a' | 0 | 0 | 0 | 0 | 0 |

It will be apparent from Table 2 that the complements for positive signals and the complement for negative signals are symmetrical with respect to each other about the zero line. In addition, the digital codes of the complements of $(n_1 + n_2)$ at the terminal 22a and of $(n_1 + n_3)$ at terminal 22b correspond to the absolute values of the signal levels. Thus, the polarity of the signal is indicated by the most significant bit $n_1$ and the mangitude of the signal is indicated by the complement.

The line decoder 23 operates to produce output signals at each of its terminals 26a–26d that are either 1 level signals to turn on the respective light emitting devices 42 or 43 and 31b–31d or are 0 level signals. For digital signals from the A/D converter 3 that corresponds to analog signals of the lowest amplitude and of either polarity applied to the input terminal 1, the line decoder 23 responds to the output signals of all of the half-adders 12a–12n and provides a 1 at the output terminal 26d and a 0 at the higher level output terminals 26a–26c. This 1 at the output terminal 26d passes through the OR gate 27d and actuates the monostable multivibrator 28d to provide a pulse of selected length to be applied to the driver 29d that controls the current that turns on the light emitting device 31d.

For a digital signal corresponding to an analog signal of the next higher magnitude, the line decoder 23 would respond to the half-adders 12a–12n and produce a 1 at the output terminal 26c. This 1 signal would pass through the OR gate 27c and would actuate the monostable multivibrator 28c and the driver 29c to turn on the light emitting device 31c. The output 1 level of the OR gate 27c would also be applied to the OR gate 27d so that even though the output of the terminal 26d dropped to 0, the light emitting device 31d would stay illuminated whenever the light emitting device 31c was illuminated. The same operation would hold ture of a 1 signal at the output terminal 26d, which would cause the light emitting device 31b as well as both of the lower light emitting devices 31c and 31d to be illuminated. Without the OR gates 27b–27d, output 1 level signals at only one of the output terminals 26b–26d would cause only the single corresponding light emitting device 31b–31d to be illuminated.

For the highest level signals corresponding either to a 1 at each of the output terminals $T_1 - T_n$, or a 0 at each of the output terminals $T_1 - T_n$, the output terminal 26a of the line decoder 23 would produce a 1 level signal. If the analog signal applied to the input terminal 1 had a positive polarity at this maximum amplitude condition, it would be a 1 at the terminal $T_1$ and a 1 at the terminal 26a. These 1 level signals applied to the AND gate 33 would produce an output 1 applied to the monostable multivibrator 37. This in turn would actuate the driver 39 to cause the light emitting device 42 to be illuminated. As shown in FIG. 4, this light emitting device is in an aperture 47 marked with a plus (+) to indicate that the analog signal peak level is a positive peak level.

On the other hand, if the maximum signal were of the negative polarity, there would be an output 1 at the terminal 26a and an output 0 at the terminal $T_1$. This would cause an output 0 from the AND gate 33, but the output 0 of the terminal $T_1$ would be inverted by the inverter 36 to become a 1. The application of this 1 to the AND gate 34 along with the 1 from the output terminal 26a would cause a 1 at the output terminal of the AND gate 34 to energize the monostable multivibrator 38. The output of the monostable multivibrator 38 would actuate the driver 40 which would cause the light emitting device 43 to be turned on. As shown in FIG. 4, this device is in an aperture 48 in the panel 46 marked with a minus (−) sign to indicate that the maximum amplitude signal had a negative polarity.

All of the monostable multivibrators 37, 38, and 28b–28d lengthen the pulses applied to them. The length of the output pulses from these monostable multivibrators can be adjusted so that the illumination of the light emitting devices 42, 43, and 31b–31d continues long enough to be clearly visible without flickering too much. This makes it possible to monitor the amplitude of the input analog signal even when that signal has a short peak of relatively high amplitude.

What is claimed is:

1. Signal level indicating apparatus responsive to pulse signals corresponding to analog signals of alternating polarity encoded according to a code in which the most significant bit indicates the polarity of the encoded analog signals, said apparatus comprising:
   A. a plurality of light emitting indicators, each identified with a signal magnitude;
   B. a plurality of bit signal input terminals to receive respective bits of the pulse signals; and
   C. a plurality of logic circuits, each connected to the bit input terminal that receives the most significant bit and to a respective one of the other input terminals to respond to the pulse signals, said logic circuits comprising output circuits connected to said indicators to actuate the same according to the instantaneous magnitude of the encoded analog signals.

2. The apparatus of claim 1 in which said logic circuits include a plurality of half-adders, each of said half-adders being connected to said bit input terminal that receives the most significant bit and to a respective one of the other bit input terminals to respond to the pulse signals therefrom.

3. The apparatus of claim 2 comprising, in addition, a line decoder connected to said half-adders and responsive to logic output signals thereof, said line decoder comprising a plurality of output terminals each connected to a respective one of said indicators to actuate said respective indicator selectively in accordance with the instantaneous magnitude of the encoded analog signals as represented by the logic signals from said half-adders.

4. The apparatus of claim 3 comprising a plurality of pulse lengthening circuits, each connected between said line decoder and a respective one of said indicators, said decoder being connected to means to receive pulses to transfer information corresponding to the logic signals from said half-adders to selected ones of said monostable multivibrators according to the instantaneous magnitude of the encoded analog signals.

5. The apparatus of claim 3 comprising a plurality of OR circuits connected to output circuits of said decoder to be energized thereby and connected in sequence to respective ones of said indicators indicating successively higher signal magnitudes, said OR gate comprising a first input terminal connected to one output terminal of said line decoder and a second terminal connected to the output of the next higher OR gate in sequence.

6. The apparatus of claim 1 in which two of said indicators comprise polarity indicating means to indicate, respectively, positive and negative polarity analog signals, and said apparatus comprises, in addition, logic means comprising:
   A. one input terminal connected to said bit input terminal receiving the most significant bit of the pulse signal and connected to the section of said logic circuit providing an output signal in response to the maximum analog signal for said system and
   B. an output terminal connected to said polarity indicating means.

7. The apparatus of claim 6 in which said logic means comprises first and second AND circuits, each having an output terminal connected to a respective one of said polarity indicating means;
   B. an inverter connecting said bit input terminal receiving the most significant bit of said pulse signal to one of said input terminals of one of said AND circuits;
   C. a non-inverting connection between said bit input terminal receiving the most significant bit of the pulse signal and one of said input terminals of the other of said AND circuits; and
   D. a second non-inverting connection from the output terminal of said decoder providing an output signal corresponding to the maximum amplitude of the encoded analog signals to the other input terminal of each of said AND circuits.

* * * * *